United States Patent
Murata et al.

(10) Patent No.: US 6,222,383 B1
(45) Date of Patent: *Apr. 24, 2001

(54) CONTROLLED PMOS LOAD ON A CMOS PLA

(75) Inventors: David Minoru Murata, San Jose; Mark Ronald Santoro; Lee Stuart Tavrow, both of Sunnyvale, all of CA (US)

(73) Assignee: Micro Magic, INc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/773,136

(22) Filed: Dec. 26, 1996

(51) Int. Cl.[7] .................... H03K 19/094; H03K 19/177
(52) U.S. Cl. .................... 326/44; 326/45; 326/41
(58) Field of Search .................... 326/45, 44, 39, 326/41

(56) References Cited

U.S. PATENT DOCUMENTS

| | | | |
|---|---|---|---|
| 4,577,190 | * | 3/1986 | Law .................... 326/38 |
| 4,668,880 | * | 5/1987 | Shoji .................... 326/45 |
| 4,728,827 | * | 3/1988 | Woo .................... 326/45 |
| 4,760,290 | * | 7/1988 | Martinez .................... 326/45 |
| 4,764,691 | * | 8/1988 | Jochem .................... 326/45 |
| 4,782,249 | * | 11/1988 | Engeler et al. .................... 326/45 |
| 4,831,285 | * | 5/1989 | Gaiser .................... 326/39 |
| 5,083,047 | * | 1/1992 | Horie et al. .................... 326/45 |

* cited by examiner

Primary Examiner—Michael Tokar
Assistant Examiner—Daniel D. Chang
(74) Attorney, Agent, or Firm—Limbach & Limbach, LLP

(57) ABSTRACT

A programmable logic array (PLA) AND plane receives data input signals from input registers and generates corresponding minterms. The minterms are OR-ed together to form a sum of products, which are provided to output latches and clocked out before the end of each clock cycle by an internal self-timed signal as PLA output data. The OR plane (or the AND plane, or both) includes NOR gates that include a plurality of NMOS transistors. Each NMOS transistor in a gate has its drain connected to a common NOR gate output node, its source connected to ground and its gate connected to receive a corresponding minterm from the AND plane. The NOR gate further includes a PMOS load transistor having its source connected to a voltage supply, its drain connected to the NOR gate output node and its gate connected to receive a timing signal that turns on the PMOS load transistor as the minterms are generated at the output of the AND plane and turns off the PMOS load transistor when the sum of products are provided at the output latches.

3 Claims, 3 Drawing Sheets

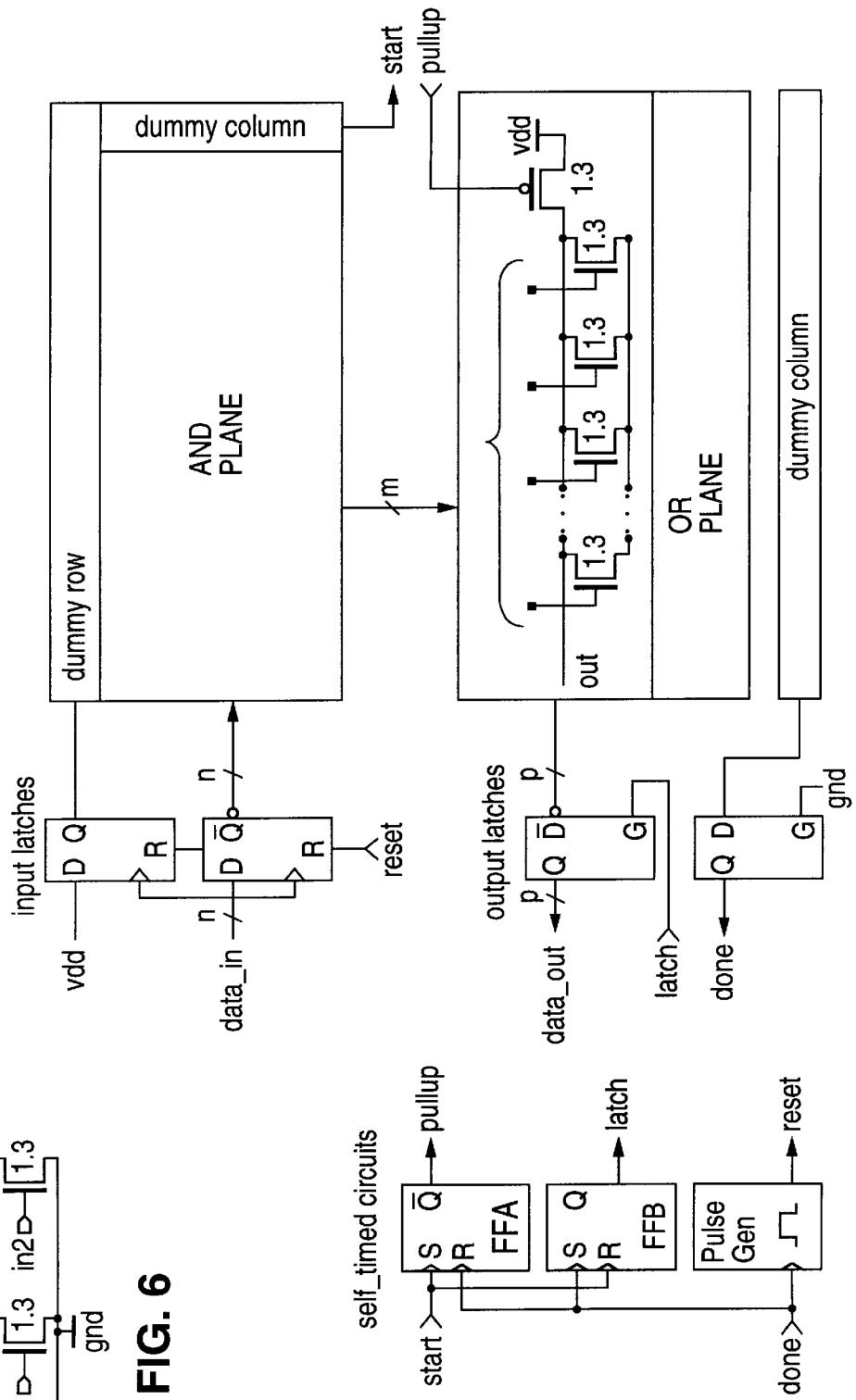
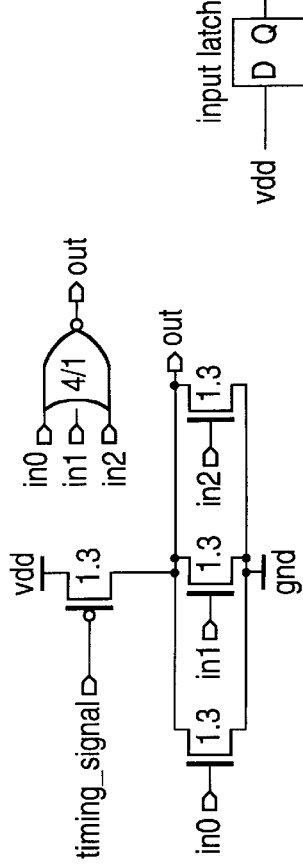
FIG. 6
FIG. 7

CONTROLLED PMOS LOAD ON A CMOS PLA

BACKGROUND OF THE INVENTION

1. Field of the Invention

The present invention relates to programmable logic array (PLA) circuits and, in particular, to the use of a controlled load in either the AND plane or the OR plane, or both, of a CMOS PLA for logical functionality, speed, power and area purposes.

2. Discussion of the Related Art

FIG. 1 shows a generic CMOS programmable logic array (PLA) 10 that consists of a set of input latches 12, output latches 14, an AND plane 16 and an OR plane 18. As shown in the accompanying timing diagrams, at the beginning of each cycle, inputs are clocked into the input latches 12. From the input latches 12, the signals are fed into the AND plane 16 where minterms are generated. These minterms are then fed into the OR plane 18 where the various minterms are "OR-ed" together to form the sum of products. The sum of the products are then latched into the output latches 14 to be used by the rest of the system.

CMOS PLA circuits can be implemented easily using pseudo NMOS NOR gates. As shown in FIG. 2, a pseudo NMOS NOR gate 20 includes parallel-connected NMOS transistors 22 with a single PMOS transistor 24 to form the load. The gates of NMOS transistors 22 form the inputs to the NOR gate 20 and the gate of the PMOS transistor 24 is tied to ground GND. The common drain nodes of the PMOS transistor 24 and the NMOS transistors 22 form the gate output node.

To implement a pseudo NMOS NOR PLA, DeMorgan's rule is used to form the AND and OR planes. By inverting the inputs to a set of pseudo NMOS NOR gates, the AND plane is constructed; by inverting the outputs of a set of pseudo NMOS NOR gates, the OR plane is constructed. An example of this type of PLA is shown in FIG. 3.

The advantage of the FIG. 3 implementation is that the design is straightforward. No other timing signals are needed in this design other than the clocks to the input and output latches. The disadvantages of this implementation are the size and power considerations common to all pseudo NMOS NOR gates. If one of the inputs to the pseudo NMOS NOR gates is high, static power is consumed since both NMOS and PMOS transistors are on. Also, the NMOS transistors must be larger than the PMOS transistor by several factors (e.g., 3× in the FIG. 2 gate) to obtain a good VOL or low output voltage. If all inputs happen to switch low, then the PMOS load transistor must be large enough to drive all the NMOS drains and the wiring capacitance to a high at the output node. In a PLA, these disadvantages are exacerbated. In the AND and OR planes, the number of inputs and the wiring length at the output node are non-trivial. This results in an implementation that is relatively large, limited in speed and consumes static power.

CMOS PLA's can also be implemented using dynamic OR gates for both the AND and OR planes. The dynamic OR gate is similar to a generic dynamic OR gate except that the ground switch transistor may be removed to keep the gate size to a minimum. Simple dynamic OR gates with and without the switch transistor are shown in FIG. 4A and FIG. 4B, respectively.

Referring to FIG. 5 and its associated timing diagrams, similar to the pseudo NMOS PLA, the dynamic PLA uses DeMorgan's rule for the AND plane. Although a dynamic AND gate can be used to implement the AND plane, a dynamic OR gate is used to avoid an excessive NMOS stack. The inverted output signals from the input registers are fed into a set of dynamic OR gates to form a NAND plane. The outputs of the dynamic NAND plane are inverted to finally complete the logical equivalent of an AND plane. Since this implementation results in the outputs of the AND plane being high during the precharge phase, the design must accommodate this condition. If switch transistors are used in the design, then timing margin must be added between the end of the evaluation period of the AND plane and the beginning of the evaluation period of the OR plane. If a switch transistor is not used, then, as in the FIG. 5 circuit, a resetting latch must be added at the AND/OR plane interface to ensure that all inputs to the OR plane are low during its precharge phase. To construct the OR plane, a set of dynamic OR gates is arrayed to fit against the AND plane.

There are several advantages of speed and power to the dynamic PLA implementation. Unlike the pseudo NMOS NOR implementation, there is no static power dissipation. Since the NMOS transistors in the dynamic OR gates are only used to pull down charge during the evaluation period, the size of these transistors and, therefore, the size of the whole array can be kept to a minimum. The disadvantage of the dynamic PLA is that the timing and, therefore, the circuit design, is considerably complex. Although dynamic circuits are relatively fast, timing margin must be added to guarantee functionality over all possible environmental and manufacturing conditions. The addition of timing margin increases the propagation delay (clock to outputs) of the PLA. For both the precharge and evaluation intervals, timing margin must be added to ensure that the outputs of the dynamic gates reach full high and low output levels. This addition of timing margin is necessary for both switch and non-switch transistor dynamic PLA designs. As previously mentioned, the switch-transistor PLA design must accommodate larger AND and OR planes due to the switch transistors; the non-switch transistor PLA design must accommodate a resetting latch between the AND and OR planes. These factors add to the overall propagation delay and the complexity of the dynamic PLA designs.

SUMMARY OF THE INVENTION

The present invention reduces the size and power of PLA's in comparison with pseudo-NMOS NOR PLAs. In comparison to dynamic PLAs, the invention reduces overall propagation delay and complexity in the design.

Referring to FIG. 6, the invention provides a pullup circuit function 100 by means of a PMOS transistor 102. The pullup circuit function 100 is similar to a static pseudo NMOS NOR gate utilizing the single PMOS transistor 102 and several NMOS transistors 104. However, in accordance with the invention, the source of the PMOS transistor 102 is connected to VDD and the gate of the PMOS transistor 102, unlike the pseudo static NMOS NOR gate, is connected to a timing chain. The drain of the PMOS transistor 102 is connected to the drains of NMOS transistors 104 which form the output of the NOR gate. The inputs are the gates of the NMOS transistors 104. All of the sources of the NMOS transistors 104 are connected to ground. The resulting invention is a controlled PMOS pullup circuit that implements a logical NOR function.

To generate the AND function with the circuit 100, DeMorgan's rule is used. Since this invention performs a logical NOR function, inverting the inputs to this circuit results in the AND function. To generate the OR function, a normal CMOS inverter is added to the output of the circuit 100.

In one particular embodiment of the invention, shown in FIG. 7, a set of input registers 106, a set of output latches 108 and a dynamic AND plane 110 are used with an OR plane 112 containing the invention. At the beginning of any clock cycle, input values are clocked into the input registers 106. Using the outputs from the input registers 106, the AND plane 110 generates minterms. As the minterms are generated at the output of the AND plane 110, the set of self-timed circuits 114 asserts a signal to turn on the PMOS load transistor. As the signals propagate through the OR plane 112, the sum of the products outputs of the OR plane 112 are latched and the PMOS pullup transistors 102 in the OR plane are turned off.

It is important to note that, like the dynamic case, although a self-timed circuit 114 is used to control the PMOS load transistor 102, this transistor is sized similarly to the PMOS transistor in the pseudo NMOS NOR gate. This means that, unlike the dynamic gate, the timing of the self-timed signal is no longer critical for proper operation of the circuit. The PMOS load transistor 102 functions similarly to the PMOS transistor in the pseudo NMOS NOR gate. However, it is switched off at the appropriate time to conserve power.

The invention can also be used to implement other PLA embodiments. Another possible embodiment is a PLA with a controlled PMOS load on the AND plane and a controlled PMOS load on the OR plane. Yet another possible PLA embodiment is to use a controlled PMOS load for the AND plane and a dynamic OR plane.

In another embodiment of the invention, both true and complementary outputs are available at the output of the AND plane. Since the OR plane is not dynamic, the inputs to the OR plane are not critical. This feature can also be implemented in a conventional dynamic or plane design. However, this added feature would require a latch between the AND and OR plane interface. Operation of the PLA is the same as in the previous paragraph; however, the minterms and their compliments from the AND plane are available for use by the OR plane.

The controlled PMOS load in the CMOS PLA of the present invention has a power advantage over the prior art in regards to pseudo NMOS NOR PLAs. In the prior art, if any input to the OR plane is high, then the OR plane burns static power. In comparison, the controlled PMOS load only burns power during the time it is turned on, and thus saves power.

The controlled load in the OR plane of a CMOS PLA has several advantages over the prior art in regards to conventional dynamic PLAs. In a conventional dynamic PLA, the size of the AND and OR plane is determined by the switch transistor. If a switch transistor is used, then the size of the array increases to accommodate this type of design and timing margin must be added between the evaluation of the AND plane and the evaluation of the OR plane. If a switch transistor is not used, then the PLA design must incorporate a resetting latch at the AND and OR plane interface as well as the addition of timing margin between the evaluation period of the AND plane and the evaluation period of the OR plane. In the controlled PMOS load of the present invention, the use of switch transistors, the addition of timing margin or the addition of resetting circuitry for the AND/OR plane interface latches are not necessary. Since these items do not exist, array size and propagation delay can be minimized.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIG. 6 is a schematic diagram illustrating a controlled PMOS pullup circuit in accordance with the present invention.

FIG. 7 is a schematic diagram illustrating a PLA with controlled PMOS pullup in the OR plane in accordance with the present invention.

DETAILED DESCRIPTION OF THE INVENTION

Figure 1:
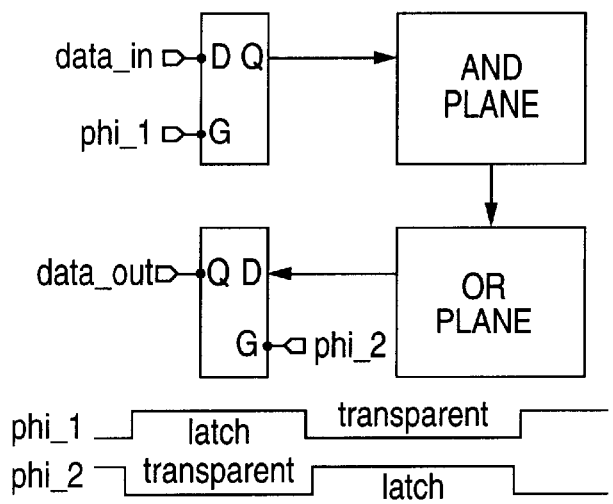
FIG. 1 is a block diagram illustrating a generic CMOS PLA.
Figure 2:
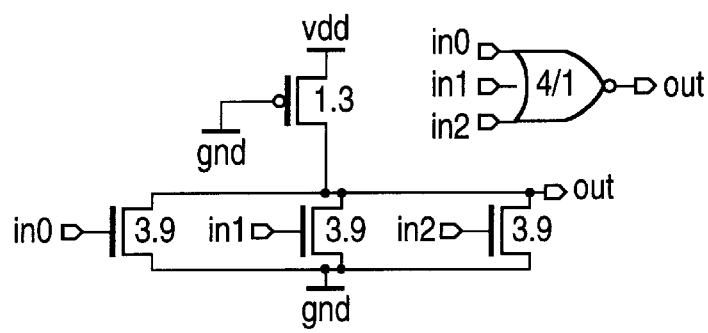
FIG. 2 is a simple schematic diagram illustrating a NMOS NOR gate.
Figure 3:
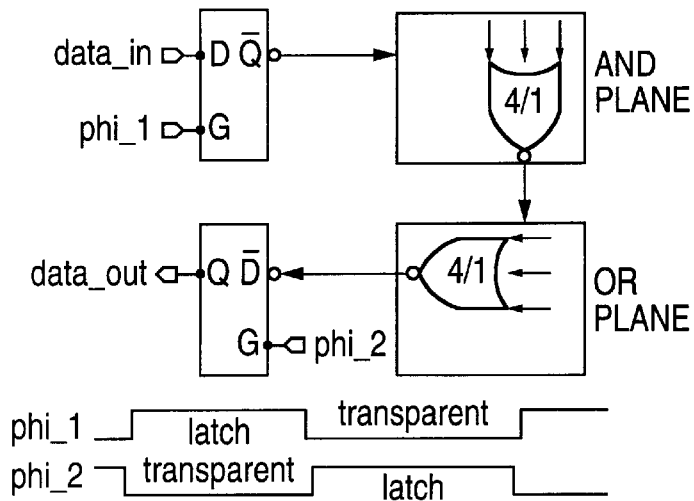
FIG. 3 is a block diagram illustrating a NMOS NOR PLA.
Figure 4A:
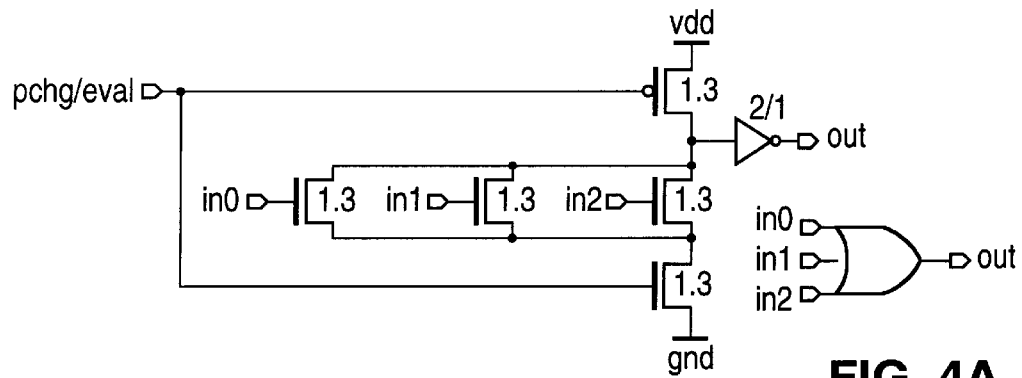
FIG. 4A is a schematic diagram illustrating a dynamic OR gate with switch transistor.
Figure 4B:
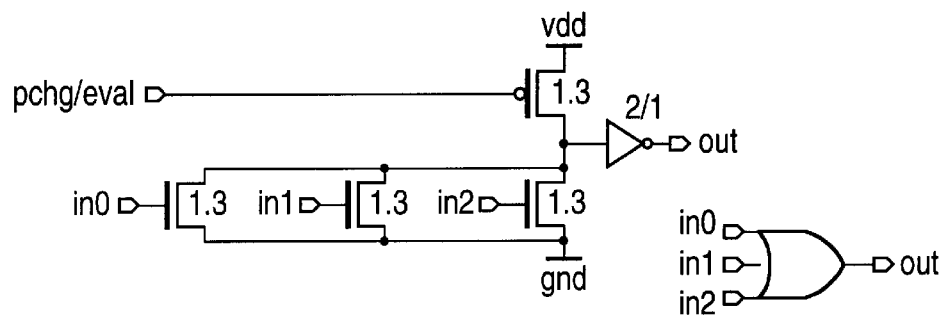
FIG. 4B is a schematic diagram illustrating a dynamic OR gate without switch transistor.
Figure 5:
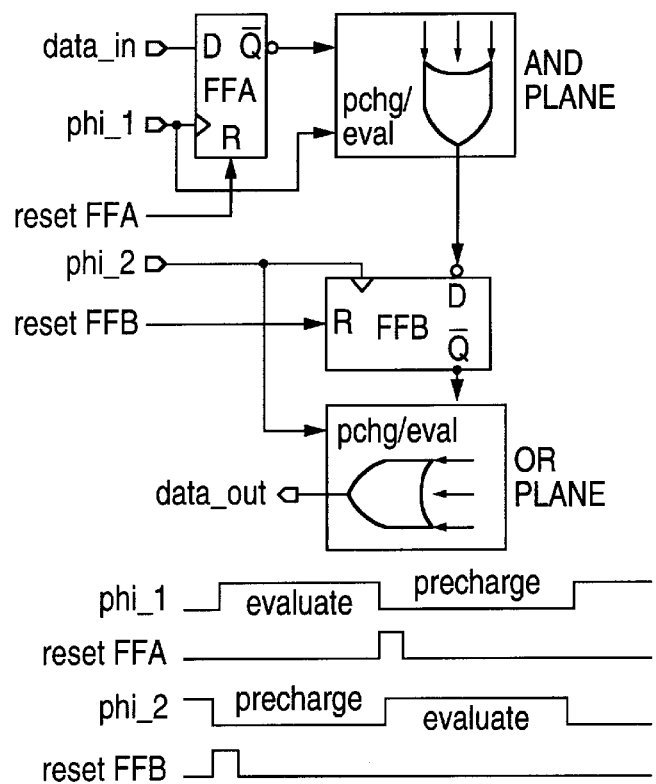
FIG. 5 is a block diagram illustrating a PLA without switch transistors.

FIG. 7 shows a block diagram of a PLA in accordance with the concepts of the present invention. The PLA includes a block of input registers 106, an AND plane 110, an OR plane 112, a block of output latches 108 and block of self-timed circuits 114. As discussed in greater detail below, the self-timed circuits 114 are used to control the PMOS load transistors 102 of the type discussed above in conjunction with the FIG. 6 circuit 100. All of the elements of the PLA are typically fabricated together on a single integrated circuit.

The input register block 106 includes a set of registers for data as well as an additional register 116 for self-timing purposes. The input registers are coupled to the AND plane 110. The additional register 116 of the input register block 106 is connected to a dummy row and dummy column of the AND plane 110 for timing purposes. The AND plane 110 is coupled to the OR plane 112 containing the controlled PMOS load transistors. The OR plane 112 also contains a dummy column for timing purposes. The OR plane 112 is coupled to the set of output latches 108. The block of self-timed circuits 114 is coupled to the input register block 106, the AND plane 110, the OR plane 112, and the output register block 108. The block of self-timed circuits 114 is used to generate a set of signals which turns the controlled PMOS load on and off at the appropriate time, latches the data at the outputs of the PLA and resets the timing register within the block of input registers 106.

In the operation of the PLA shown in FIG. 7, at the beginning of each clock period, new signal values are latched into the input register block 106. The additional register 116 within the input register block 106 is used for timing purposes and is assumed to be reset to a logical zero prior to the beginning of any clock cycle. The outputs of the input registers 106 are fed into the AND plane 110. The outputs of the AND plane 110 are the minterms, with the exception of the output signal coming from the dummy row and dummy column. At the start of the clock cycle, the AND plane's dummy row and column takes the "logical one" from the input timing register 116 and generates a delayed "logical one" matching the worst-case loaded row and column of the AND plane. This delayed "logical one" is denoted as the "start" node in FIG. 7. The "logical one" signal at the "start" node is then fed into the block of self-timed circuits 114.

Within the block of self-timed circuits 114, the "start" signal is connected to the "set" input of set-reset flip-flop A (SRFFA) and the "reset" input of set-reset flip-flop B (SRFFB). The output of SRFFA is denoted as the "pullup" node and is set to "0" upon receiving the delayed "logical one" from the "start" node. The output of SRFFB is denoted as the "latch" node and is reset "0" upon receiving the delayed "logical one" from the "start" node. The "pullup" node is connected to the OR plane 112 and turns on the controlled PMOS load transistors. The "latch" node is connected to the output latch block 108 and is used to make all the output latches transparent. Once the controlled PMOS load transistor is turned on, outputs are generated at the OR plane 112 and are fed into the block 108 of output latches. The outputs from the output latch block 108 are taken as the outputs of the PLA with the exception of the one latch 118 used for timing purposes. The timing latch 118 within the output latch block 108 is designed to match the propagation delay of all the other data latches within this block and generates a high signal "1" on the "done" node. The high signal on the "done" node is fed into the "reset" input of SRFFA, the "set" input of SRFFB, and the pulse-generator circuit of the self-timed circuit block. The output of SRFFA is reset and the "pullup" rises to a high "1", causing the controlled PMOS load transistors in the OR plane 112 to turn off. At the same time, the output of SRFFB is set "1" causing the "latch" signal to rise to a high "1" latching the OR plane output signals. The high signal "1" on the "done" node is also fed into the pulse generator within the timing block 114, generating a momentary high pulse on the "reset" node. The momentary high on the "reset" node forces the output of the input timing register to a low "0". At the conclusion of resetting the timing register of the input block 106, the PLA is ready for the next cycle.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A programmable logic array (PLA) that includes a plurality of input memory elements into which data input signals are clocked at the beginning of each clock cycle applied to the input memory elements, an AND plane that receives the data input signals from the input memory elements and generates corresponding minterms based upon the data input signals, an OR plane in which the minterms are OR-ed together to form a sum of products, and a plurality of output memory elements to which the sum of products are provided and clocked out of the output memory elements before the end of each clock cycle by means of an internal self-timed signal as PLA output data, and wherein the OR plane includes at least one NOR gate that includes:

a plurality of NMOS transistors, each NMOS transistor having its drain connected to a common NOR gate output node, its source connected to ground and its gate connected to receive a corresponding minterm from the AND plane; and a PMOS load transistor having its source connected to a voltage supply, its drain connected to said NOR gate output node, and its gate connected to receive a timing signal that turns on the PMOS load transistor as the minterms are generated at the output of the AND plane and turns off the PMOS load transistor when the sum of the products are provided to the output memory elements, and wherein the input memory elements include a set of input data registers and an input timing register, the input timing register being responsive to a reset signal to reset to logical zero prior to the beginning of any clock cycle, outputs of the input data registers being provided to the AND plane, the AND plane including means that responds to a logical one received from the input timing register by generating a start signal, the PLA further comprising self-timed circuitry that responds to the start signal by generating a pullup signal that is applied to the gate of the PMOS load transistor to turn the PMOS load transistor on, the self-timed circuitry further responding to the start signal by generating a latch signal that is applied to a set of data output latches included in the output memory elements to allow the sum of products from the OR plane to propagate to outputs of the data output latches, the output memory elements including an output timing latch that generates a done signal when the sum of the products has propagated to the outputs of the output data latches, the self-timed circuitry responding to the done signal by inactivating the pullup signal to turn off the PMOS load transistor and by activating the reset signal to reset the output of the input timing register to zero.

2. A method of operating a programmable logic array (PLA), the PLA including a plurality of input memory elements into which data input signals are clocked at the beginning of each clock cycle applied to the input memory elements, an AND plane that receives the data input signals from the input memory elements and generates corresponding minterms based upon the data input signals, an OR plane in which the minterms are OR-ed together to form a sum of products, and a plurality of output memory elements to which the sum of products are provided and clocked out of the output memory elements before the end of each clock cycle by means of an internal self-timed signal as PLA output data, and wherein the OR plane includes at least one NOR gate that includes a plurality of NMOS transistors, each NMOS transistor having its drain connected to a NOR gate output node, its source connected to ground and its gate connected to receive a corresponding minterm from the AND plane, and a PMOS load transistor having its source connected to a voltage supply, its drain connected to the NOR gate output node, and its gate connected to receive a pullup signal that turns on the PMOS load transistor as the minterms are generated at the output of the AND plane and turns off the PMOS load transistor when the sum of the products are provided to the output memory elements, the method comprising:

providing a reset signal to an input timing element included in the input memory elements to reset the input timing element to logical zero prior to the beginning of any clock cycle;

at the start of the clock cycle, generating a start signal corresponding to the propagation delay of the worst-case loaded row and column of the AND plane;

responding to the start signal by generating the pullup signal that is applied to the gate of the PMOS load transistor to turn the PMOS load transistor on;

further responding to the start signal by generating a latch signal that is applied to the output memory elements to allow the sum of products from the OR plane to propagate to outputs of the output memory elements;

generating a done signal when the sum of the products has propagated to the outputs of the output memory elements; and responding to the done signal by inactivating the pullup signal to turn off the PMOS load transistor and by activating the reset signal to reset the output of the input timing element to zero.

3. A programmable logic array (PLA) comprising:

a plurality of input memory elements into which data input signals are clocked at the beginning of each clock cycle applied to the input memory elements;

an AND plane that receives the data input signals from the input memory elements and generates corresponding minterms based upon the data input signals, the AND plane including at least one NOR gate that includes (i) a plurality of parallel-connected NMOS transistors, each NMOS transistor included in said NOR gate having its drain connected to a common NOR gate output node, its source connected to ground, and its gate connected to receive a corresponding input data signal from the input memory elements and (ii) a PMOS load transistor having its source connected to a voltage supply, its drain connected to said NOR gate output node; and its gate connected to receive a timing signal;

an OR plane in which the minterms are OR-ed together to form a sum of products;

a plurality of output memory elements to which the sum of products formed by the OR plane is provided and clocked out of the output memory elements before the end of each clock cycle by an internal self-timed clock signal as PLA output data, and wherein the timing signal turns on the PMOS load transistor as the data input signals are provided at the outputs of the input memory elements and turns off the PMOS load transistor when the minterms are provided to the OR plane; and wherein the input memory elements include a set of input data registers and an input timing register, the input timing register being responsive to a reset signal to reset to logical zero prior to the beginning of any clock cycle, outputs of the input data registers being provided to the AND plane, the AND plane including means that responds to a logical one received from the input timing register by generating a start signal, the PLA further comprising self-timed circuitry that responds to the start signal by generating a pullup signal that is applied to the gate of the PMOS load transistor to turn the PMOS load transistor on, the self-timed circuitry further responding to the start signal by generating a latch signal that is applied to a set of data output latches included in the output memory elements to allow the sum of products from the OR plane to propagate to outputs of the data output latches, the output memory elements including an output timing latch that generates a done signal when the sum of the products has propagated to the outputs of the output data latches, the self-timed circuitry responding to the done signal by inactivating the pullup signal to turn off the PMOS load transistor and by activating the reset signal to reset the output of the input timing register to zero.

* * * * *